(12) United States Patent
Cheng et al.

(10) Patent No.: US 8,138,543 B2
(45) Date of Patent: Mar. 20, 2012

(54) HYBRID FINFET/PLANAR SOI FETS

(75) Inventors: Kangguo Cheng, Guilderland, NY (US); Bruce B. Doris, Brewster, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 12/621,460

(22) Filed: Nov. 18, 2009

(65) Prior Publication Data
US 2011/0115023 A1 May 19, 2011

(51) Int. Cl.
*H01L 27/01* (2006.01)
(52) U.S. Cl. .......... 257/331; 257/E21.703; 438/588
(58) Field of Classification Search .......... 257/331, 257/347, E21.248, E21.703; 438/588, 738
See application file for complete search history.

(56) References Cited

U.S. PATENT DOCUMENTS

| | | | |
|---|---|---|---|
| 6,867,433 B2 | 3/2005 | Yeo | 257/67 |
| 7,291,886 B2 | 11/2007 | Doris | 257/350 |
| 7,479,421 B2 | 1/2009 | Kavalieros | 438/197 |
| 2005/0167750 A1* | 8/2005 | Yang et al. | 257/347 |

FOREIGN PATENT DOCUMENTS
WO  WO/2007/115954  10/2007

OTHER PUBLICATIONS

V. Narayanan, et al., "Band-Edge High-Performance High-/Metal Gate n-MOSFETs using Cap Layers Containing Group IIA and IIIB Elements with Gate-First Processing for 45 nm and Beyond", Symp. VLSI Tech. (2006) pp. 224-225.
K. Tatsumura, et al. "Intrinsic Correlation between Mobility Reduction and Vt shift due to Interface Dipole Modulation in HfSiON/SiO$_2$ stack by La or Al addition" IEDM Tech. Dig. (2008) pp. 25-28.
K. Kita, et al. "Intrinsic Origin of Electric Dipoles Formed at High-k/SiO$_2$ Interface" IEDM Tech. Dig. (2008) pp. 29 32.

* cited by examiner

*Primary Examiner* — Thomas L Dickey
(74) *Attorney, Agent, or Firm* — George Sai-Halasz; Louis J. Percello

(57) ABSTRACT

A circuit structure is disclosed which contains least one each of three different kinds of devices in a silicon layer on insulator (SOI): a planar NFET device, a planar PFET device, and a FinFET device. A trench isolation surrounds the planar NFET device and the planar PFET device penetrating through the SOI and abutting the insulator. Each of the three different kinds of devices contain a high-k gate dielectric layer and a mid-gap gate metal layer, each containing an identical high-k material and an identical mid-gap metal. Each of the three different kinds of devices have an individually optimized threshold value. A method for fabricating a circuit structure is also disclosed, which method involves defining portions in SOI respectively for three different kinds of devices: for a planar NFET device, for a planar PFET device, and for a FinFET device. The method also includes depositing in common a high-k gate dielectric layer and a mid-gap gate metal layer, and using workfunction modifying layers to individually adjust thresholds for the various kinds of devices.

16 Claims, 5 Drawing Sheets

HYBRID FINFET/PLANAR SOI FETS

BACKGROUND

The present invention relates to electronic devices and circuits. In particular, it relates to FET devices with metal gates, high-k dielectrics, and to planar and FinFET devices.

As FET (Field-Effect-Transistor) devices are being scaled down, the technology allows for ever more variety in devices and circuit structures, some of which may possess unique advantages. Performance and cost benefits may be derived by judicious application of appropriate device varieties for particular circuit applications.

BRIEF SUMMARY

A circuit structure is disclosed that contains least one each of three different kinds of devices in a silicon layer on insulator (SOI): a planar NFET device, a planar PFET device, and a FinFET device. The circuit structure also has a trench isolation penetrating through the SOI and abutting the insulator. This trench isolation surrounds the planar NFET device and the planar PFET device. Each of the three different kinds of devices contain a high-k gate dielectric layer and a mid-gap gate metal layer, while the high-k gate dielectric layer contains an identical high-k material for all three different kinds of devices, and the mid-gap gate metal layer contains an identical mid-gap metal for all three different kinds of devices. For the FinFET device this high-k gate dielectric layer overlays the sidewalls, and the gate metal layer is in direct contact with the gate dielectric layer. The planar NFET device and the planar PFET device also has individual workfunction modifying layers inbetween the high-k gate dielectric layer and the gate metal layer. The circuit structure is characterized as being a combination of a planar CMOS circuit and a FinFET circuit in SOI, with the planar CMOS circuit containing the planar NFET device and the planar PFET device, and each of the three different kinds of devices have an optimized threshold value.

A method for fabricating a circuit structure is also disclosed, which method involves providing a silicon layer on an insulator (SOI), and in the SOI defining portions respectively for at least one each of three different kinds of devices, for a planar NFET device, for a planar PFET device, and for a FinFET device. The method further includes fabricating a trench isolation that surrounds the portions, with the trench isolation penetrating through the SOI and abutting the insulator. The trench isolation that surrounds the FinFET portion is then removed and sidewalls are being exposed on the FinFET device. Next, one may form in common a high-k gate dielectric layer and a mid-gap gate metal layer for the three different kinds of devices. For the FinFET device the high-k gate dielectric layer overlays the sidewalls and the mid-gap gate metal layer is in direct contact with the gate dielectric layer, while for the planar NFET device and for the planar PFET device deploying individual workfunction modifying layers inbetween the high-k gate dielectric layer and the mid-gap gate metal layer.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1:
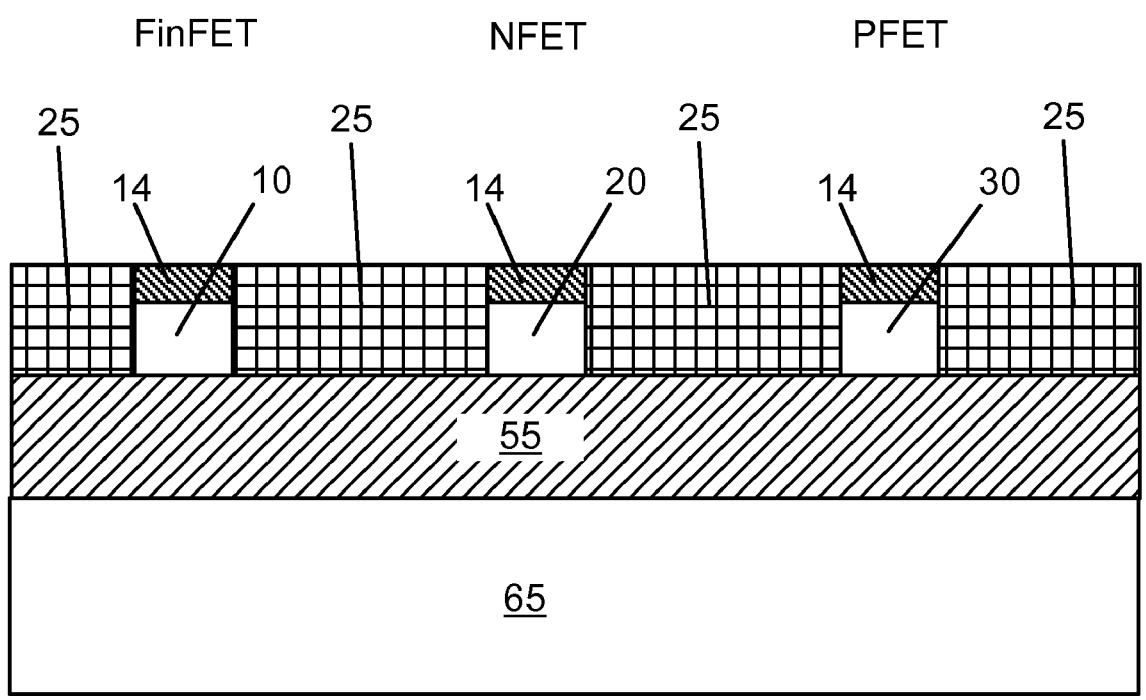
FIG. 1 shows in a schematic cross section an initial stage of an embodiment of the method for fabricating a circuit structure.

It is understood that Field Effect Transistor-s (FET) are well known in the electronic arts. Standard components of a FET are the source, the drain, the body in-between the source and the drain, and the gate. The gate is overlaying the body and is capable to induce a conducting channel in the body between the source and the drain. In the usual nomenclature, the channel is hosted by the body. The gate is typically separated from the body by the gate insulator, or gate dielectric. Depending whether the "on state" current in the channel is carried by electrons or by holes, the FET comes in two types: as NFET or PFET. (In different nomenclature the NFET and PFET devices are often referred to as NMOS and PMOS devices.) It is also understood that frequently the NFET and PFET devices are used together in circuits. Such NFET, PFET combination circuits may find application in analogue circuits, or in digital circuits where they are typically coupled into CMOS configurations. Typically, and in the nomenclature of the present disclosure, as well, NFET and PFET devices are planar. The source, drain, the channel are all associated with a single surface of a device body, which surface is without major curvatures or facets. In this disclosure the names NFET and PFET, when used without further adjectives, refer to the planar FETs.

A FinFET, or Tri-Gate, device is a FET but one of a special geometric configuration. These devices are non-planar, they are three dimensional structures hosted by a fin structure. In FinFETs, the body of the transistor is formed in a fin rising out of a planar background, typically having both vertical and horizontal surfaces. The gate of the FinFET may engage the top surface, as well as the vertically oriented body surfaces on both faces, or sidewalls, resulting in connected planes being used for transistor channel formation. Such FET devices, with fin-type bodies, have several advantages as known in the art. In state of the art technologies, the dimensions of fin structures that serve as fin-type device bodies are of a height of about 10 nm to 100 nm, and of a width typically of over 3 nm to about 100 nm.

Combining planar CMOS circuits with a FinFET circuit has the advantage that one may use the planar devices in the logic circuits, while using the FinFET devices in their potentially more suitable role, such as in static random access memories (SRAM).

In FET operation an inherent electrical attribute is the threshold voltage. When the voltage between the source and the gate exceeds the threshold voltage, the FETs are capable to carry current between the source and the drain. Since the threshold is a voltage difference between the source and the gate of the device, in general, NFET threshold voltages are positive, and PFET threshold voltages are negative.

In embodiments of the present invention all three kinds of devices: the planar NFET device, the planar PFET device, as well as the FinFET device may have their thresholds individually adjusted. High performance small FET devices require precise threshold voltage control. As operating voltages decrease, to below 1 V, threshold voltages also have to decrease, and threshold variation becomes less tolerable. Advanced devices may use high-k gate dielectrics and metal gates. Every element, such as a different gate dielectric, or a different gate material, may influence the threshold voltage.

As FET devices are scaled to smaller size, the traditional way of setting threshold voltage, namely by adjusting body and channel doping, loses effectiveness. The effective-workfunction of the gate material, and the gate insulator properties are becoming important factors in determining the thresholds of small FETs. Such, so called small FETs have typically gate lengths, or gate-stack lengths, of less than 50 nm. The gate-stack length, or gate length, is defined in the direction of the device current flow between the source and the drain. For small FETs the technology is progressing toward the use of metallic gates and high-k dielectrics for gate insulators.

In small devices with low equivalent oxide thickness (EOT) gate insulators, the workfunction of the gate may significantly influence the threshold voltage. In the general terminology of the art, one characterizes the workfunction of the gate in relation to the Si energy gap. For instance, in the art the term "band-edge workfunction" means that the gate has a workfunction like that of $n^+$, or $p^+$Si. Similarly, "mid-gap", or "quarter-gap" workfunction mean a gate appearing to have a workfunction roughly like intrinsic silicon, or one halfway between intrinsic Si and heavily doped Si.

Manufacturing of NFET, PFET, CMOS, and FinFET is very well established in the art. It is understood that there are large number of steps involved in such processing, and each step may have practically endless variations, known to those skilled in the art. For embodiments of this disclosure it is understood that the whole range of known processing techniques are available for fabricating the devices, and only those process steps will be detailed that are related to the embodiments of the present invention.

Embodiments of the present invention disclose circuit structures, and methods of fabrication, for combining FinFET devices and planar CMOS in a silicon layer on an insulator (SOI). The fabrication of the three different kinds of devices is done in a manner which uses essentially the same processing as it is done for common planar CMOS. In spite of this simplicity in processing, the threshold of each kinds of device may be individually optimized.

One may commence processing with a single crystal silicon layer on an insulator (SOI). Such entities are known. Most commonly they are SOI substrates, meaning a silicon substrate, a buried oxide layer (BOX), and a silicon layer on top. But for the embodiments of the present invention an SOI substrate while it is typical, it is not necessarily required. It is sufficient to have a silicon layer supported by an insulator underneath, which, for instance, could be $Al_2O_3$, or something else. The SOI may be between 10 nm to 100 nm thick, but more typically between 15 nm to 40 nm thick. An approximately below 40 nm thickness range allows for common fabrication processes for forming the FinFET and the planar devices.

FIG. 1 shows in a schematic cross section an initial stage of an embodiment of the method for fabricating the circuit structure. Portions have been defined in the SOI for at least one each of three different kinds of devices, for a FinFET device 10, for a planar NFET device 20, and for a planar PFET device 30. Underneath the SOI portions there is an insulator 55, which is typically the buried oxide layer (BOX) of a so called SOI substrate. For an SOI substrate, the oxide 55 is sustained on a silicon substrate 65. As FIG. 1 shows, the defined SOI portions are covered by pad layers 14, and trench isolations 25 have been fabricated that surround the three device portions. The trench isolations 25 penetrate through the SOI, and are abutting the insulator 55. In representative embodiment of the disclosure the pad layers 14 are of nitride, and the material of the trenches 25 is oxide.

Starting with a Si layer on an insulator, one may arrive at the state of processing that is schematically depicted in FIG. 1, by using commonly known methods. Such methods may include, without limitations, the deposition onto the SOI a blanket pad layer, typically of nitride. Masking steps may follow to shield the device portions, and then steps removing the rest of the SOI down to the insulator, typically by reactive ion etching (RIE). The masking, and then the etching of the SOI outside the masked portions is the process commonly referred to as "defining", or "patterning". In the present case it is understood that the three differing device portions 10, 20, 30, have been so defined. Oxide may be deposited next, followed by chemical mechanical polishing (CMP), which results in the even surface of pad layers 14 and filled trenches 25, as shown in FIG. 1. The widths of the various kinds of device portions 10, 20, 30, and the width of any given kind of portion, for instance that of the NFET, in various parts of the circuit structure may vary greatly, depending on the requirements of the specific circuit to be fabricated. The portion's minimum width at this stage of fabrication is determined by the state of lithographic capabilities of the applied technology, which may be as small as 5 nm.

Figure 2:
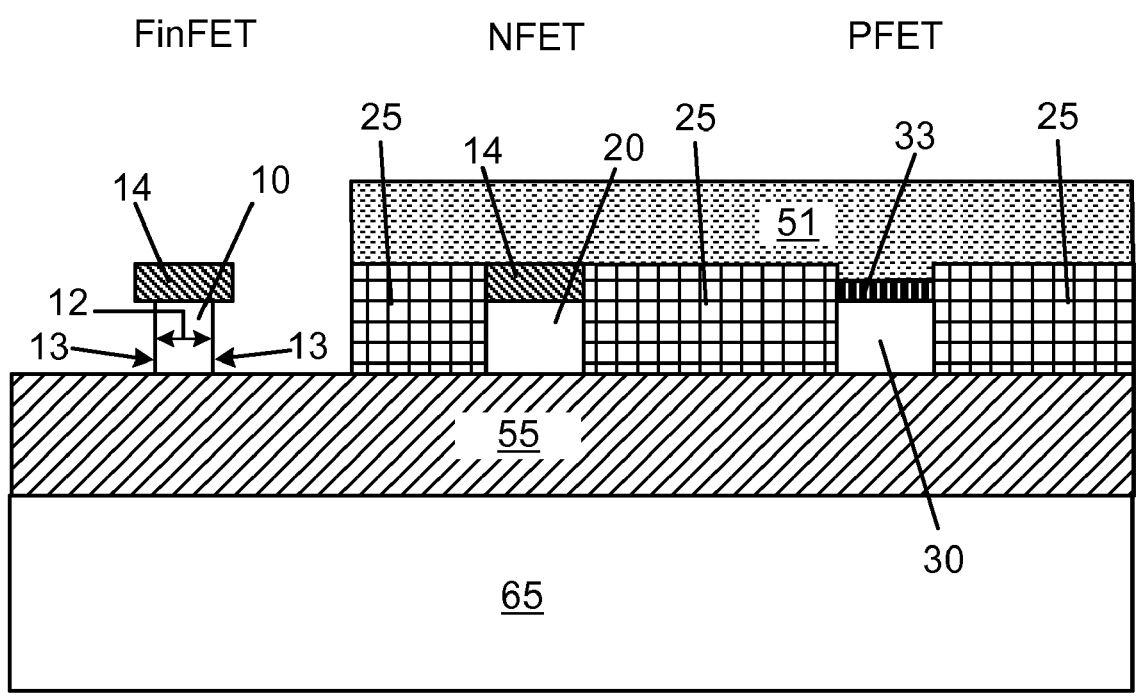
FIG. 2 shows the state of fabrication after epitaxial SiGe for the PFET, and FinFET width trimming.

FIG. 2 shows the state of fabrication after epitaxial SiGe for the PFET, and FinFET trimming. The SiGe layer 33 is on the top surface of the Si PFET portion 30. The top surface for each of the portions, it is understood of being the surface which is apart from the insulator 55, and it is substantially in parallel with the insulator's plane.

The SiGe layer may have several advantages for the PFET device. Due to its positioning the epitaxial SiGe layer 33 becomes the channel region of the PFET. Having SiGe channel region may help in optimizing the threshold, and may lead to better carrier mobility. The SiGe covering the whole of the PFET device portion 30 is also present in the source/drain region of the PFET. This is advantageous because it lowers the contact resistance for the device electrodes. In advanced small devices electrode contact resistance has become a concern. It is known, that having SiGe under the silicide is a way of lowering contact resistance. The composition of the SiGe layer 33 may be between 10% to 40% Ge, or more typically between 15% to 30% Ge. Having an epitaxial SiGe layer for the PFET channel region, however, is optional for the embodiments of the present disclosure.

As FIG. 2 shows, the trench isolation 25 that surrounded the FinFET 10 portion has been removed. Consequently, sidewalls 13 on the FinFET 10 are being exposed.

FIG. 2 also shows that the FinFET device width 12, which is the same as the defined FinFET device portion, is narrower than the widths of the planar FET devices. This width 12 is in reference to the minimum widths of the three different kinds of devices since, as discussed earlier, one may process device widths that are of pre-specified widths, sometimes larger than the minimum achievable. The FinFET has been etched under the pad layer 14 from the directions of the sidewalls, to achieve the narrowest width 12 of the various devices.

One may arrive at the state of processing schematically depicted in FIG. 2 from the one shown in FIG. 1 by methods known in the art. There may be several masking steps involved during such processing. A block mask may be used to cover the FinFET 10 and planar NFET 20 regions, while the pad layer in the planar PFET 30 region may be removed, and the underlying SOI exposed. The SiGe layer 33 may then be formed on the top surface of the planar PFET device 30 using blanket epitaxial growth. The term "blanket" means that the deposition is carried out without further masking. In various embodiments of the disclosure the SiGe 10 layer thickness may be between about 1 nm and 30 nm, or more typically between about 5 nm to 20 nm. As it was already discussed, the deposition of the epitaxial SiGe layer is optional.

In describing a structure, the adjective "epitaxial" is typically used to indicate that a particular material has been epitaxially grown. The structural consequence of epitaxial deposition is that the deposited material and the host material, at their common interface, have the same symmetry and crystalline orientation. Further terms that may be used, such as "epitaxial relation", "epitaxially", "epitaxy", "epi", "epitaxial growth" etc. carry their customary usage, crystalline continuity across the common interface.

The trench isolation 25, typically of oxide, which surrounds the FinFET device 10 portion may be removed using a second block mask 51, as depicted on FIG. 2. This mask 51 covers the planar NFET device 20 and the planar PFET device 30 portions. The trench isolation 25 may be removed by commonly known dry etching, such as RIE, or by wet etching, such as by a buffered HF (BHF) etch.

With the block mask 51 and the pad layer 14 in place over the FinFET device portion, the SOI layer 10 in the FinFET portion can optionally be trimmed from the direction of the sidewalls. This may result in a narrower SOI in FinFET portion 10 than the planar devices SOI portions 20, 30. The SOI may be trimmed by dry a etch, for instance with HBr chemistry. Alternatively, an oxidation step may be used which converts Si into $SiO_2$, and after the $SiO_2$ has been formed it may be wet etched using buffered HF, or another oxide removal chemistry. Or, the SOI may be trimmed by wet etch, for instance an ammonia etch.

Figure 3:
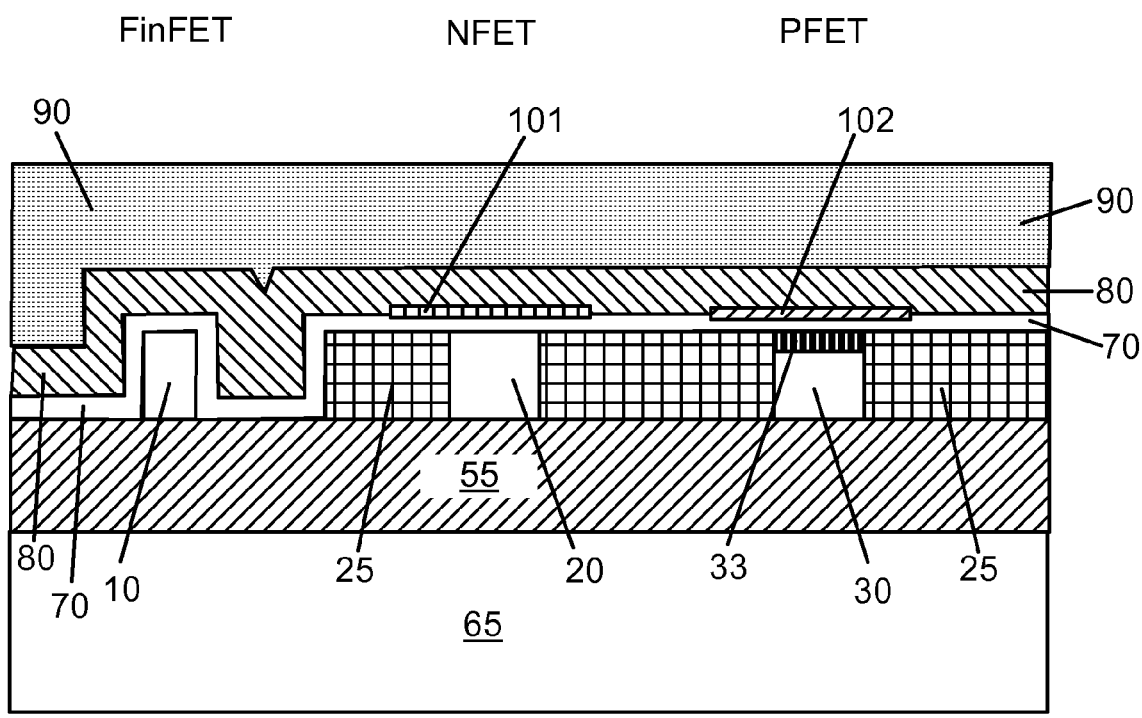
FIG. 3 shows a later stage of fabrication, having deposited gate-stack materials.

FIG. 3 shows a later stage of fabrication, having deposited gate-stack materials over the three different kinds of devices. A high-k gate dielectric layer 70 and a mid-gap gate metal layer 80 are deposited in common for all three kinds of devices. This common processing, and by consequence, the use respectively same, or identical, materials for all three kinds of devices simplifies fabrication involving FinFET and planar devices. A polysilicon layer 90 may also be deposited in common for all three devices.

In the embodiment shown in FIG. 3, there is no pad layer 14 over the FinFET device 10. Thus, in the shown embodiment the FinFET device is tri-gated, as it conducts on three surfaces, on the two sidewalls 13, and on the top surface. Alternatively the pad layer 14 may stay in place over the FinFET device 10, in which case one obtains a double gated device, conducting along its sidewalls 13.

Inbetween the deposition of the high-k gate dielectric layer 70 and the mid-gap gate metal layer 80, one may deploy individual workfunction modifying layers 101, 102, respectively, for the planar NFET device 20 and for said planar PFET device 30.

In typical embodiments of the disclosure the high-k material in the high-k gate dielectric layer 70 may be $HfO_2$, but other similar materials, such as, without intent of limiting, $ZrO_2$, $HfO_2$, HfSiO, HfSiON may also be considered. The mid-gap metal in the mid-gap gate metal layer 80 may be TiN, but other metals with similar workfunctions may also be applied. The workfunction modifying layer 101 for the NFET device 20, may contain lanthanum (La) in a form of an oxide, typically LaO. The workfunction modifying layer 102 for the PFET device 30, may contain aluminum (Al) in a form of an oxide, typically $Al_2O_3$.

The materials chosen for gate dielectric and for the gate-stacks, as well as the processing steps, serve the purpose of optimizing thresholds of all three kinds of devices.

The SOI of the FinFET device 10 preferably remains undoped. The high-k gate dielectric layer 70 overlays the sidewalls, and possibly the top surface of the undoped FinFET device 10. Since the mid-gap gate metal layer 80 is in direct contact with the gate dielectric layer 70 for the FinFET device 10, the result may be a fully depleted FinFET device with a proper midgap threshold voltage value of approximately 0.5 V.

The SOI in the planar NFET and PFET portions 20, 30 may be implanted by using block masks (not shown), and selecting suitable dopants for each kind of device, as known in the art. With the use of the same block masks, one may deposit the appropriate workfunction modifying layers, for the NFET device 101 containing La, and for the PFET device 102 containing Al. As commonly known, such workfunction modifying layers, together with the implanted dopants may shift the thresholds of the NFET device 20 and of the PFET device each by about 0.3 V in opposite directions. In this manner the planar NMOS and PMOS devices may have thresholds with the desired band-edge workfunction values, meaning absolute value threshold voltages in the 0.1 V to 0.3 V domain.

Figure 4A:
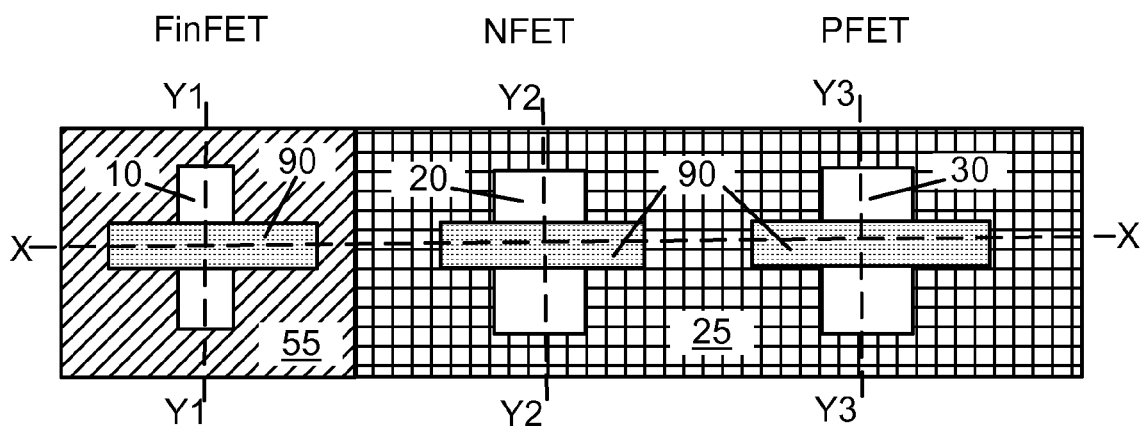
FIG. 4A-4C show several views of the circuit structure following gate patterning.
Figure 4B:
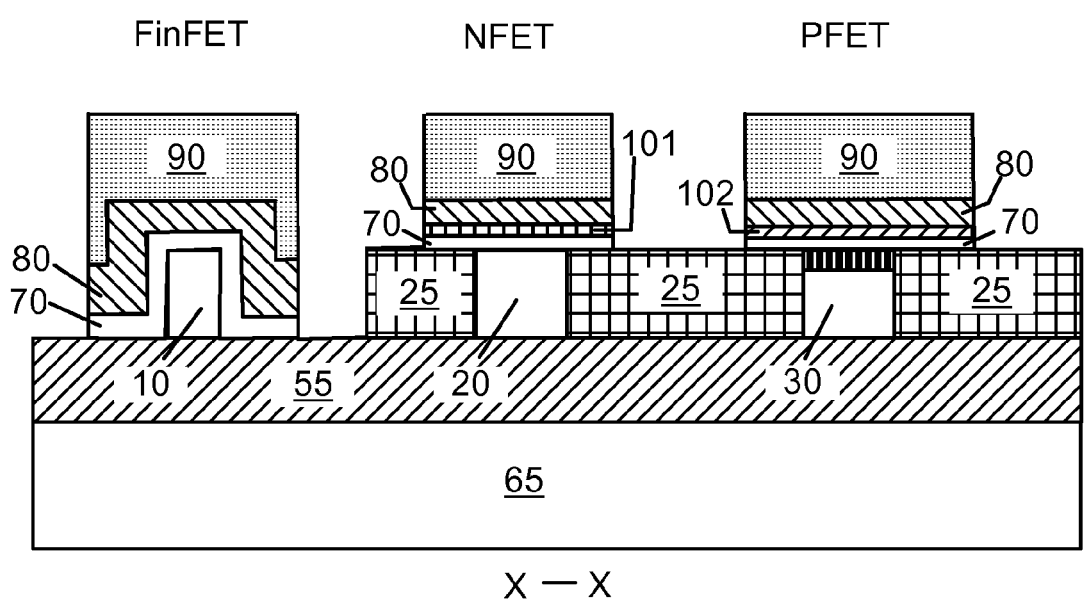
Figure 4C:
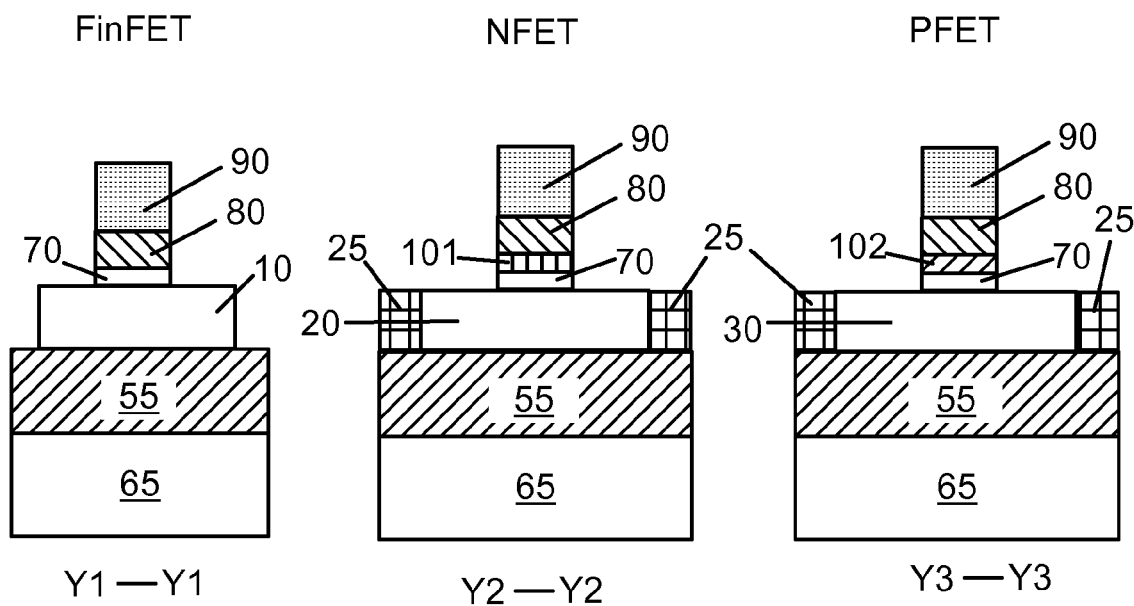

Following the fabrication stage shown in FIG. 3, the devices may be completed by commonly known steps. FIG. 4A-4C show several views of the circuit structure after gate patterning.

FIG. 4A gives a top view of the three devices. The gates have been patterned, namely delineated by lithography, or by some other means, and the materials outside the gate-stacks removed, typically by RIE. Due to the relatively thin SOI, the topography between the FinFET 10 portion and the planar 20, 30 portions is small. Therefore, a common RIE process with sufficient overetch can be used to pattern both FinFET and planar SOI gates. From the top, the polysilicon layer 90 of the gate-stacks is visible, as well as the trench 25 oxide surrounding the planar devices, and the BOX 55 on which the FinFET device 10 stands. FIG. 4A indicates the location of cross sectional cuts, X-X, Y1-Y1, Y2-Y2, and Y3-Y3, that are schematically depicted in FIGS. 4B and 4C.

FIG. 4B shows the X-X cross sectional cut, which is similar to FIG. 3, except for materials that were removed during gate patterning.

FIG. 4C depicts the cross sectional views along the Y1-Y1, Y2-Y2, and Y3-Y3 cut lines. The conventional planar devices and the FinFET device have all processed together in simple steps know in CMOS processing.

Finally, the device structure fabrication may be completed by the usual processes, such as forming halo, source/drain extension, spacer, source/drain, possible silicidations, and others, all typically using conventional techniques.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "underneath", "top", "side", "over", "underneath" etc., as used herein refer to relative location and orientation of various portions of the structures with respect to one another, and are not intended to suggest that any particular absolute orientation with respect to external objects is necessary or required.

The foregoing specification also describes processing steps. It is understood that the sequence of such steps may vary in different embodiments from the order that they were detailed in the foregoing specification. Consequently, the ordering of processing steps in the claims, unless specifically stated, for instance, by such adjectives as "before" or "after", does not imply or necessitate a fixed order of step sequence.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A circuit structure, comprising:
least one each of three different kinds of devices in a silicon layer on insulator (SOI): a planar NFET device, a planar PFET device, and a FinFET device, wherein said FinFET device comprises sidewalls;
a trench isolation penetrating through said SOI and abutting said insulator, wherein said trench isolation surrounds said planar NFET device and said planar PFET device;
wherein each of said three different kinds of devices comprise a high-k gate dielectric layer containing an identical high-k material for all of said three different kinds of devices, and wherein each of said three different kinds of devices comprise a mid-gap gate metal layer containing an identical mid-gap metal for all of said three different kinds of devices, wherein for said FinFET device said high-k gate dielectric layer overlays said sidewalls and said mid-gap gate metal layer is in direct contact with said high-k gate dielectric layer;
individual workfunction modifying layers inbetween said high-k gate dielectric layer and said mid-gap gate metal layer, respectively for said planar NFET device and for said planar PFET device; and
wherein said circuit structure is characterized as being a combination of a planar CMOS circuit and a FinFET circuit in SOI, wherein said planar CMOS circuit comprises said planar NFET device and said planar PFET device, and wherein each of said three different kinds of devices have an individually optimized threshold value.

2. The circuit structure of claim 1, wherein each of said three different kinds of devices have a minimum width, wherein said minimum width of said FinFET device is narrower than said minimum widths of said planar NFET device and said planar PFET device.

3. The circuit structure of claim 1, wherein said planar PFET device has a channel region and said channel region is in an epitaxial SiGe layer, wherein said epitaxial SiGe layer covers said SOI for said PFET device.

4. The circuit structure of claim 1, wherein said identical high-k material is $HfO_2$.

5. The circuit structure of claim 1, wherein said identical mid-gap metal is TiN.

6. The circuit structure of claim 1, wherein said workfunction modifying layer for said planar NFET device comprises lanthanum (La).

7. The circuit structure of claim 1, wherein said workfunction modifying layer for said planar PFET device comprises aluminum (Al).

8. The circuit structure of claim 1, wherein said FinFET device has a body and said body is in an essentially undoped state.

9. A method for fabricating a circuit structure, comprising:
providing a silicon layer on an insulator (SOI);
in said SOI, defining portions respectively for at least one each of three different kinds of devices: for a planar NFET device, for a planar PFET device, and for a FinFET device;
fabricating a trench isolation that surrounds said portions, wherein said trench isolation penetrates through said SOI abutting said insulator;
removing said trench isolation that surrounds said FinFET portion, wherein exposing sidewalls on said FinFET device;
forming in common a high-k gate dielectric layer and a mid-gap gate metal layer for said three different kinds of devices, wherein for said FinFET device said high-k gate dielectric layer overlays said sidewalls and said mid-gap gate metal layer is in direct contact with said high-k gate dielectric layer;
deploying individual workfunction modifying layers inbetween said high-k gate dielectric layer and said mid-gap gate metal layer, respectively for said planar NFET device and for said planar PFET device; and
wherein said circuit structure is characterized as combining a planar CMOS circuit with a FinFET circuit, wherein said planar CMOS circuit comprises said planar NFET and said planar PFET device, and individually adjusting threshold values for each one of said three different kinds of devices.

10. The method of claim 9, further comprising:
following said removal of said trench isolation that surrounds said FinFET portion, etching said sidewalls, wherein said FinFET portion has a width, and said etching narrows said width.

11. The method of claim 9, wherein said portion of said planar PFET device has a top surface which is apart from said insulator and is substantially in parallel with said insulator, said method further comprises forming by selective epitaxy a SiGe layer on said top surface.

12. The method of claim 9, further comprising:
selecting said high-k gate dielectric layer to comprise $HfO_2$.

13. The method of claim 9, further comprising:
selecting said mid-gap gate metal layer to comprise TiN.

14. The method of claim 9, further comprising:
selecting said workfunction modifying layer for said planar NFET device to comprise lanthanum (La).

15. The method of claim 9, further comprising:
selecting said workfunction modifying layer for said planar PFET device to comprise aluminum (Al).

16. The method of claim 9, wherein said FinFET device has a body formed of said SOI, said method further comprises fabricating said body in an essentially undoped state.

* * * * *